US010651775B2

(12) United States Patent
Jang et al.

(10) Patent No.: US 10,651,775 B2
(45) Date of Patent: May 12, 2020

(54) INVERTER SYSTEM FOR VEHICLE

(71) Applicants: Hyundai Motor Company, Seoul (KR); Kia Motors Corporation, Seoul (KR)

(72) Inventors: Ji Woong Jang, Hwaseong-si (KR); Ki Young Jang, Incheon (KR); Jin Hwan Jung, Suwon-si (KR); Sang Cheol Shin, Suwon-si (KR); Beom Sik Kim, Gwangmyeong-si (KR); Ki Jong Lee, Osan-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/132,828

(22) Filed: Sep. 17, 2018

(65) Prior Publication Data

US 2019/0326844 A1    Oct. 24, 2019

(30) Foreign Application Priority Data

Apr. 18, 2018    (KR) .................... 10-2018-0045167

(51) Int. Cl.
*H02P 27/08* (2006.01)
*H02P 23/14* (2006.01)
(Continued)

(52) U.S. Cl.
CPC ............ *H02P 27/085* (2013.01); *B60L 50/51* (2019.02); *H02P 23/14* (2013.01); *H02P 25/024* (2016.02); *H03K 17/082* (2013.01)

(58) Field of Classification Search
CPC .................................................. H02P 27/085
(Continued)

(56) References Cited

U.S. PATENT DOCUMENTS 5,414,339 A    5/1995    Masaki et al.
7,071,639 B2 *  7/2006    Ochiai ................... B60L 15/08
                                                          318/139
(Continued)

FOREIGN PATENT DOCUMENTS

JP              5104258 B2    12/2012
JP              5851267 B2     2/2016
KR    10-2011-0105034 A       9/2011

OTHER PUBLICATIONS

European Search Report dated Jul. 1, 2019 for European Patent Application No. 19169445.4.

*Primary Examiner* — David Luo
(74) *Attorney, Agent, or Firm* — Morgan, Lewis & Bockius LLP (57) ABSTRACT

An inverter system for a vehicle may include an energy storage device configured to store electrical energy; a first inverter including a plurality of first switching elements, and converting the energy into AC power; a second inverter including a plurality of second switching elements different from the first switching elements, being connected to the energy storage device in parallel with the first inverter, and converting the energy into AC power; a motor driven by receiving the AC power; a PWM signal generating device configured to generate a reference Pulse-width modulation (PWM) signal for controlling driving of the motor; and a PWM signal converting device configured to convert the reference PWM signal into both a first PWM signal input into the first inverter to drive the first switching elements, and a second PWM signal input into the second inverter to drive the second switching elements.

18 Claims, 4 Drawing Sheets

(51) Int. Cl.
*H02P 25/024* (2016.01)
*B60L 50/51* (2019.01)
*H03K 17/082* (2006.01)

(58) Field of Classification Search
USPC .................................................. 318/503, 494
See application file for complete search history.

(56) References Cited

U.S. PATENT DOCUMENTS

| | | | |
|---|---|---|---|
| 7,099,756 B2 * | 8/2006 | Sato | B60L 50/16 |
| | | | 701/22 |
| 7,277,304 B2 | 10/2007 | Stancu et al. | |
| 8,193,743 B2 * | 6/2012 | Yamada | H02M 7/53875 |
| | | | 318/162 |
| 9,024,563 B2 | 5/2015 | Bünte et al. | |
| 9,692,342 B2 | 6/2017 | Kano et al. | |
| 9,834,098 B2 | 12/2017 | King et al. | |
| 9,853,570 B2 | 12/2017 | Maly | |
| 9,917,543 B1 | 3/2018 | Sarlioglu et al. | |
| 10,348,222 B2 | 7/2019 | Dutta et al. | |
| 10,411,532 B2 | 9/2019 | Lee et al. | |
| 2004/0262057 A1 | 12/2004 | Kumar | |
| 2005/0082096 A1 | 4/2005 | Oono | |
| 2010/0013438 A1 | 1/2010 | Anwar et al. | |
| 2015/0043254 A1 | 2/2015 | Preckwinkel et al. | |
| 2015/0117073 A1 | 4/2015 | Flett | |
| 2017/0250623 A1 | 8/2017 | Maly | |
| 2019/0006979 A1 | 1/2019 | Suzuki et al. | |

\* cited by examiner

INVERTER SYSTEM FOR VEHICLE

CROSS REFERENCE TO RELATED APPLICATION

The present application claims priority to Korean Patent Application No. 10-2018-0045167, filed Apr. 18, 2018, the entire contents of which is incorporated herein for all purposes by this reference.

BACKGROUND OF THE INVENTION

Field of the Invention

The present invention relates generally to an inverter system for a vehicle. More particularly, the present invention relates to an inverter system for a vehicle, wherein the inverter system is capable of reducing switching loss, improving efficiency, and increasing output power.

Description of Related Art

Recently, technologies related to environmentally friendly vehicles using electrical energy as power for driving vehicles in a response to the crisis of air pollution and oil depletion have been actively developed. The environmentally friendly vehicles include hybrid electric vehicles, fuel cell electric vehicles, and electric vehicles.

Meanwhile, in a conventional inverter system for a vehicle, to achieve high power, a plurality of silicon-insulated gate bipolar transistor (Si-IGBT) elements is connected in parallel to drive the motor. In the conventional inverter system, high power may be achieved by connecting a plurality of Si-IGBTs to the motor in parallel, but in the fuel economy mode where the output demand of the motor is low, switching and conduction losses occur in the switching elements and thus the fuel efficiency of the vehicle is lowered as a whole.

To solve the present problem, research on a silicon carbide-field effect transistor (SiC-FET) element having a small loss in the fuel economy mode in which the output demand of the motor is low has been actively conducted. However, since the SiC-FET element is expensive compared with the Si-IGBT element and the size thereof is small, there is a disadvantage that the heat dissipation characteristic is not good. Therefore, there is a limit in configuring the inverter by connecting a plurality of SiC-FET elements in parallel. Accordingly, it is necessary to develop an inverter system configured for employing both the advantages of a Si-IGBT element and a SiC-FET element.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an inverter system for a vehicle, wherein the inverter system is configured such that a first inverter and a second inverter with different switching elements are connected together in parallel, and PWM signals with different on/off timings are input to the first inverter and the second inverter respectively such that the respective inverters are driven independently, whereby it is possible to reduce switching loss, improve efficiency, and increase output power.

In various aspects of the present invention, there is provided an inverter system for a vehicle, the inverter system including: an energy storage device configured to store electrical energy; a first inverter including a plurality of first switching elements, and converting the energy stored in the energy storage device into AC power; a second inverter including a plurality of second switching elements different from the first switching elements, being connected to the energy storage device in parallel with the first inverter, and converting the energy stored in the energy storage device into AC power; a motor driven by receiving the AC power converted by the first inverter and the second inverter; a PWM signal generating device configured to generate a reference Pulse-width modulation (PWM) signal for controlling driving of the motor; and a PWM signal converting device configured to convert the reference PWM signal into both a first PWM signal input into the first inverter to drive the first switching elements, and a second PWM signal input into the second inverter to drive the second switching elements with on/off timing different from on/off timing of the first PWM signal.

Each of the first switching elements may be a Silicon carbide-field effect transistor (SiC-FET), and each of the second switching elements may be a Silicon-insulated gate bipolar transistor (Si-IGBT).

The PWM signal converting device may be configured to convert the reference PWM signal into the first PWM signal when an output demand of the motor is less than a predetermined criterion, such that the first switching elements are turned on earlier than the second switching elements by a first reference time and are turned off later than the second switching elements by a second reference time.

The PWM signal converting device may be configured to convert the reference PWM signal into the second PWM signal when an output demand of the motor is less than a predetermined criterion, such that the second switching elements are turned on later than the first switching elements by a first reference time and are turned off earlier than the first switching elements by a second reference time.

The first reference time may be greater than a turn-on delay time of the first switching elements.

The second reference time may be greater than a turn-off delay time of the second switching elements.

The PWM signal converting device may be configured to convert the reference PWM signal into the first PWM signal when the output demand of the motor is greater than the predetermined criterion, such that the first switching elements are turned on before the first reference time when the second switching elements are turned on, wherein the second switching elements are turned on and the first switching elements are turned off after a third reference time, and the first switching elements are turned on again before a fourth reference time when the second switching elements are turned off, wherein the second switching elements are turned off and the first switching elements are turned off after the second reference time.

When the output demand of the motor is greater than the predetermined criterion, the first switching elements may be turned off after the second switching elements are turned on and after the third reference time due to a limitation of a maximum current.

The PWM signal converting device may be configured to convert the reference PWM signal into the second PWM signal when the output demand of the motor is greater than the predetermined criterion, such that the second switching elements are turned on later than the first switching elements by the first reference time and are turned off earlier than the first switching elements turned on again by the second reference time.

The third reference time may be greater than a turn-on delay time of the second switching elements.

The fourth reference time may be greater than a turn-on delay time of the first switching elements.

The first inverter may have switching and conduction losses lower than switching and conduction losses of the second inverter.

When an output demand of the motor is less than a predetermined criterion, the first switching elements may be driven.

When an output demand of the motor is greater than a predetermined criterion, the second switching elements may be driven.

The reference PWM signal may be a PWM signal generated such that an output current of the motor is fed back from the PWM signal generating device, the output current of the motor is compared with a current command, and the output current of the motor follows the current command.

The inverter system may further include: a voltage measuring device configured to measure voltage of the first switching elements; a current measuring device configured to measure current flowing into the second switching elements; and an overcurrent determining device configured to determine whether an overcurrent flows into the first switching elements and the second switching elements based on a voltage value measured by the voltage measuring device and a current value measured by the current measuring device.

The overcurrent determining device may determine that an overcurrent flows into the first switching elements when the voltage value measured by the voltage measuring device is higher than a predetermined voltage value.

The overcurrent determining device may derive a voltage value applied to a resistor of the second switching elements based on the current measured by the current measuring device, and determine that an overcurrent flows into the second switching elements when the derived voltage value is higher than a predetermined voltage value.

According to an exemplary embodiment of the present invention, a first inverter and a second inverter with different switching elements are connected together in parallel, and PWM signals with different on/off timings are input to the first inverter and the second inverter respectively such that the respective inverters are driven independently, whereby it is possible to reduce switching loss, improve efficiency, and increase output power.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinbelow, an inverter system for a vehicle according to an exemplary embodiment of the present invention will be described in more detail with reference to the accompanying drawings.

Figure 1:
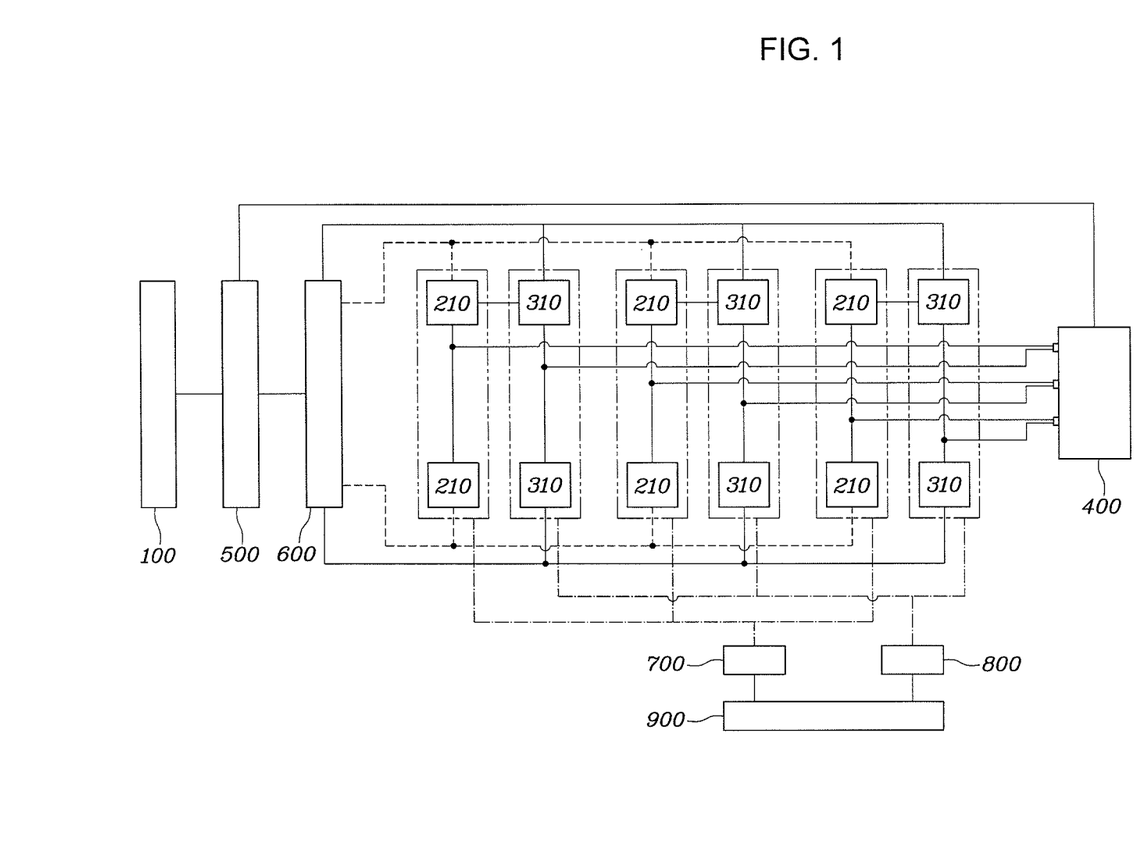
FIG. 1 is a view showing an overall configuration of an inverter system for a vehicle according to an exemplary embodiment of the present invention.

As shown in FIG. 1, an inverter system for a vehicle according to an exemplary embodiment of the present invention may include an energy storage device 100, a first inverter, a second inverter, a motor 400, a PWM signal generating device 500, and a PWM signal converting device 600, and may further include a voltage measuring device 700, a current measuring device 800, and an overcurrent determining device 900 according to an exemplary embodiment of the present invention. Hereinbelow, details of the inverter system for a vehicle according to an exemplary embodiment of the present invention will be described in detail.

The energy storage device 100 is configured to store electrical energy, and is configured to supply electrical energy driving the motor 400. The energy storage device 100 may be a battery that stores electrical energy driving a motor of a vehicle and supplies the electrical energy. However, it is merely an exemplary embodiment of the present invention, and various devices such as a supercapacitor may be used as the energy storage device of the present invention as long as it can serve to store and supply electrical energy for driving a motor of a vehicle.

The first inverter may include a plurality of first switching elements 210, and is configured to convert the energy stored in the energy storage device 100 into AC power. Herein, the first switching elements 210 are connected in parallel with each other, and a plurality of output terminals of the first switching elements 210 connected in parallel may be connected to the motor 400, respectively. Furthermore, a plurality of first switching elements 210 in the first inverter can convert DC power delivered from the energy storage device 100 into AC power, but the conversion of DC power to AC power through the inverter is a well-known technology, so a detailed description thereof will be omitted.

The second inverter may include a plurality of second switching elements 310 different from the first switching elements 210, and is configured to convert the energy stored in the energy storage device 100 into AC power. Herein, the plurality of second switching elements 310 are connected in parallel with each other, and a plurality of output terminals of the second switching elements 310 connected in parallel may be connected to the motor 400, respectively. Furthermore, the second inverter may be connected to the energy storage device 100 in parallel with the first inverter. Furthermore, a plurality of second switching elements 310 in the second inverter can convert DC power delivered from the energy storage device 100 into AC power, but the conversion of DC power to AC power through the inverter is a well-known technology, so a detailed description thereof will be omitted.

Meanwhile, the first inverter having the first switching elements may have switching and conduction losses lower than those of the second inverter. Furthermore, the first inverter may have a rated output for driving the motor smaller than that of the second inverter.

Meanwhile, in an exemplary embodiment of the present invention, the first switching elements 210 may be a Silicon carbide-field effect transistor (SiC-FET), and the second switching elements 310 may be a Silicon-insulated gate bipolar transistor (Si-IGBT). Hereinafter, for convenience of description, it is assumed that the first switching elements 210 are SiC-FET elements and the second switching elements 310 are Si-IGBT elements.

Figure 4:
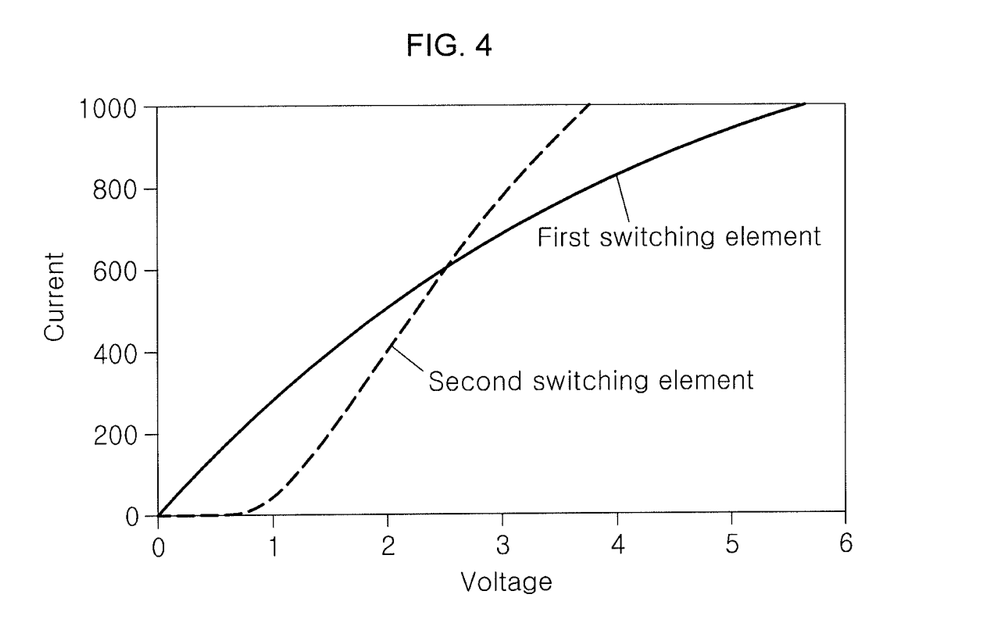
FIG. 4 is a view showing the current-voltage characteristics of first switching elements and second switching elements, in the inverter system for a vehicle according to the exemplary embodiment of the present invention.

Referring to FIG. 4, the first switching elements 210 are configured such that the voltage-current curve has linearity and increases when a gate is turned on, and have a low on-voltage in the low-load or low-current section.

On the other hand, the second switching elements 310 are configured such that the voltage-current curve has no linearity and has a knee-voltage when a gate is turned on, and the current does not increase when a voltage less than the knee-voltage is applied and the current rises when a voltage higher than the knee-voltage is applied. Furthermore, contrary to the first switching elements 210, the second switching elements 310 have a low on-voltage in the high-load or high-current section.

In an exemplary embodiment of the present invention, the first switching elements 210 and the second switching elements 310 are connected in parallel based on the characteristics of the first switching elements 210 and the second switching elements 310 described above, and when an output demand of the motor is less than a predetermined criterion, that is, in the low-load or low-current section, the first switching elements 210 are driven such that the motor 400 is driven, whereby it is possible to reduce switching loss and thus to improve overall vehicle efficiency and fuel economy; when the output demand of the motor is greater than the predetermined criterion, that is, in the high-load or high-current section, the second switching elements 310 are driven such that the motor 400 is driven, whereby high power is output.

The motor 400 may be driven by receiving AC power converted by the first inverter and the second inverter. In other words, the motor 400 can drive a vehicle through the power received through the first inverter or the second inverter.

The PWM signal generating device 500 can generate a reference Pulse-width modulation (PWM) signal for controlling driving of the motor 400. Herein, the reference PWM signal may be a PWM signal generated such that an output current of the motor 400 is fed back from the PWM signal generating device 500, the output current of the motor 400 is compared with a current command, and the output current of the motor 400 follows the current command.

The PWM signal converting device 600 can receive the reference PWM signal generated from the PWM signal generating device 500 and convert the same into both a first PWM signal input into the first inverter to drive the first switching elements 210, and a second PWM signal input into the second inverter to drive the second switching elements 310. Herein, as shown in FIG. 2 and FIG. 3, the first PWM signal and the second PWM signal may have different on/off timing.

Figure 2:
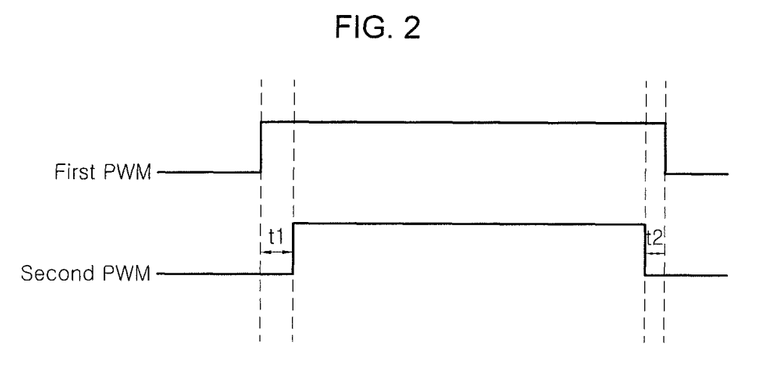
FIG. 2 is a view showing a first PWM signal and a second PWM signal that are converted by a PWM signal converting device and input into a first inverter and a second inverter when an output demand of a motor is less than a predetermined criterion, in the inverter system for a vehicle according to the exemplary embodiment of the present invention.
Figure 3:
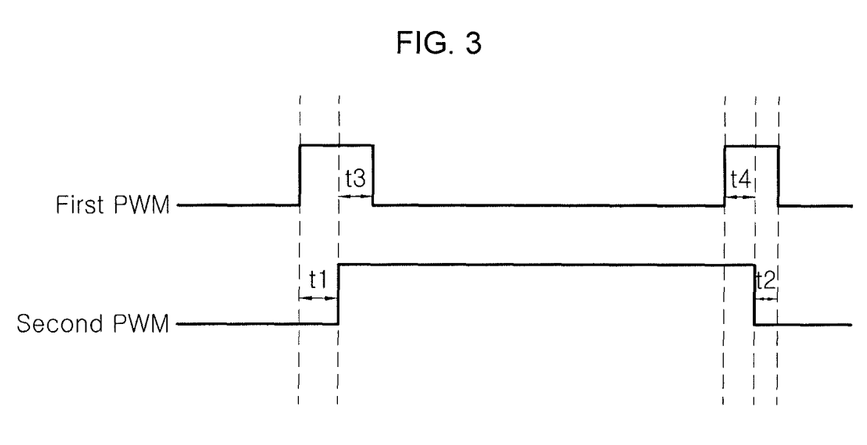
FIG. 3 is a view showing the first PWM signal and the second PWM signal that are converted by the PWM signal converting device and input into the first inverter and the second inverter when the output demand of the motor is greater than the predetermined criterion, in the inverter system for a vehicle according to the exemplary embodiment of the present invention.

To be more specific, as shown in FIG. 2, the PWM signal converting device 600 may be configured to convert the reference PWM signal into the first PWM signal when the output demand of the motor 400 is less than a predetermined criterion, such that the first switching elements 210 are turned on earlier than the second switching elements 310 by a first reference time t1 and are turned off later than the second switching elements 310 by a second reference time t2.

Furthermore, as shown in FIG. 2, the PWM signal converting device 600 may be configured to convert the reference PWM signal into the second PWM signal when the output demand of the motor 400 is less than a predetermined criterion, such that the second switching elements 310 are turned on later than the first switching elements 210 by the first reference time t1 and are turned off earlier than the first switching elements 210 by the second reference time t2.

Herein, the first reference time t1 denotes a delay time until the second switching elements 310 are turned on after the first switching elements 210 are turned on. Here, if the second switching elements 310 are turned on in the state where the first switching elements 210 are not sufficiently turned on since the first reference time t1 is shorter than a predetermined time, additional switching loss may occur at the second switching elements 310. On the other hand, if the first reference time t1 is turned on longer than a predetermined time, since the first switching elements 210 are driven alone in a longer time, the power loss may be greater than the case where the first switching elements 210 and the second switching elements 310 are turned on in parallel. Accordingly, the first reference time t1 is preferably greater than the turn-on delay time of the first switching elements 210.

Furthermore, the second reference time t2 denotes a delay time until the first switching elements 210 are turned off after the second switching elements 310 are turned off. Here, additional switching loss at the second switching elements 310 may be prevented only when the first switching elements 210 are turned off after the second switching elements 310 are turned off. Accordingly, the second reference time t2 is preferably greater than the turn-on delay time of the second switching elements 310.

Meanwhile, as shown in FIG. 3, the PWM signal converting device 600 may be configured to convert the reference PWM signal into the first PWM signal when the output demand of the motor 400 is greater than the predetermined criterion, such that the first switching elements 210 are turned on before the first reference time t1 when the second switching elements 310 are turned on, wherein the second switching elements 310 are turned on and the first switching elements 210 are turned off after a third reference time t3, and the first switching elements 210 are turned on again before a fourth reference time t4 when the second switching elements 310 are turned off, wherein the second switching elements 310 are turned off and the first switching elements 210 are turned off after the second reference time t2. Herein, the reason why the first switching elements 210 are turned off after the second switching elements 310 are turned on and after the third reference time t3 is to limit the maximum current of the first switching elements 210. Compared to the second switching elements 310, the first switching elements 210 may have a problem of heat generation due to a small heat dissipation area. To prevent such problem, the first switching elements 310 may be turned off after a predetermined time to limit the maximum current of the first switching elements 210.

Furthermore, as shown in FIG. 3, the PWM signal converting device 600 may be configured to convert the reference PWM signal into the second PWM signal when the output demand of the motor 400 is greater than the predetermined criterion, such that the second switching elements 310 are turned on later than the first switching elements 210 by the first reference time t1 and are turned off earlier than the first switching elements 210 turned on again by the second reference time t2.

Herein, the third reference time t3 denotes a delay time until the first switching elements 210 are turned off after the second switching elements 310 are turned on when the output demand of the motor is greater than the predetermined criterion. Here, the first switching elements 210 must be turned off after the second switching elements 310 are sufficiently turned on. Accordingly, the third reference time t3 is preferably greater than the turn-on delay time of the second switching elements 310.

Furthermore, the fourth reference time t4 denotes a delay time until the first switching elements 210 are turned off before the second switching elements 310 are turned off when the output demand of the motor is greater than the predetermined criterion. In other words, the second switching elements 310 must be turned off after the first switching elements 210 are sufficiently turned on. Accordingly, the fourth reference time t4 is preferably greater than the turn-on delay time of the first switching elements 210.

According to the above-described manner, in an exemplary embodiment of the present invention, when the first PWM signal and the second PWM signal converted by the PWM signal converting device 600 are applied to the gates of the first switching elements 210 and the second switching elements 310, respectively, according to the characteristics of the first switching elements 210 and the second switching elements 310 described with reference to FIG. 4, in the case where the output demand of the motor is less than a predetermined criterion, the first switching elements 210 are driven such that the motor 400 is driven, and in the case where the output demand of the motor is greater than the predetermined criterion, the second switching elements 310 are driven such that the motor 400 is driven. In other words, in the case where the output demand of the motor is less than a predetermined criterion, the first switching elements 210 are driven such that the motor 400 is driven, whereby it is possible to reduce switching loss and thus to improve overall vehicle efficiency and fuel economy, and in the case where the output demand of the motor is greater than the predetermined criterion, the second switching elements 310 are driven such that the motor 400 is driven, whereby high power is output.

The voltage measuring device 700 is configured to measure voltage of the first switching elements 210. To be more specific, voltage measuring device 700 can measure the drain-source voltage VDS of the first switching elements 210.

The current measuring device 800 is configured to measure current of the second switching elements 310. Depending on embodiment the current measuring device 800 may be a current sensor mounted in the second switching elements 310.

The overcurrent determining device 900 can determine whether an overcurrent flows into the first switching elements 210 and the second switching elements 310 based on a voltage value of the first switching elements 210 measured by the voltage measuring device 700 and a current value of the second switching elements 310 measured by the current measuring device 800.

To be more specific, the overcurrent determining device 900 can determine that an overcurrent flows into the first switching elements 210 when the drain-source voltage VDS of the first switching elements 210 measured by the voltage measuring device 700 is higher than a predetermined voltage value.

Furthermore, the overcurrent determining device 900 can derive a voltage value applied to a resistor of the second switching elements 310 based on the current measured by the current measuring device 800, and can determine that an overcurrent flows into the second switching elements 310 when the derived voltage value is higher than a predetermined voltage value.

As described above, since the overcurrent determining device 900 is configured to determine whether an overcurrent flows into the first switching elements 210 and the second switching elements 310 based on a voltage value of the first switching elements 210 measured by the voltage measuring device 700 and a current value of the second switching elements 310 measured by the current measuring device 800, it is possible to protect the first switching elements 210 and the second switching elements 310 from overcurrent.

Figure 5:
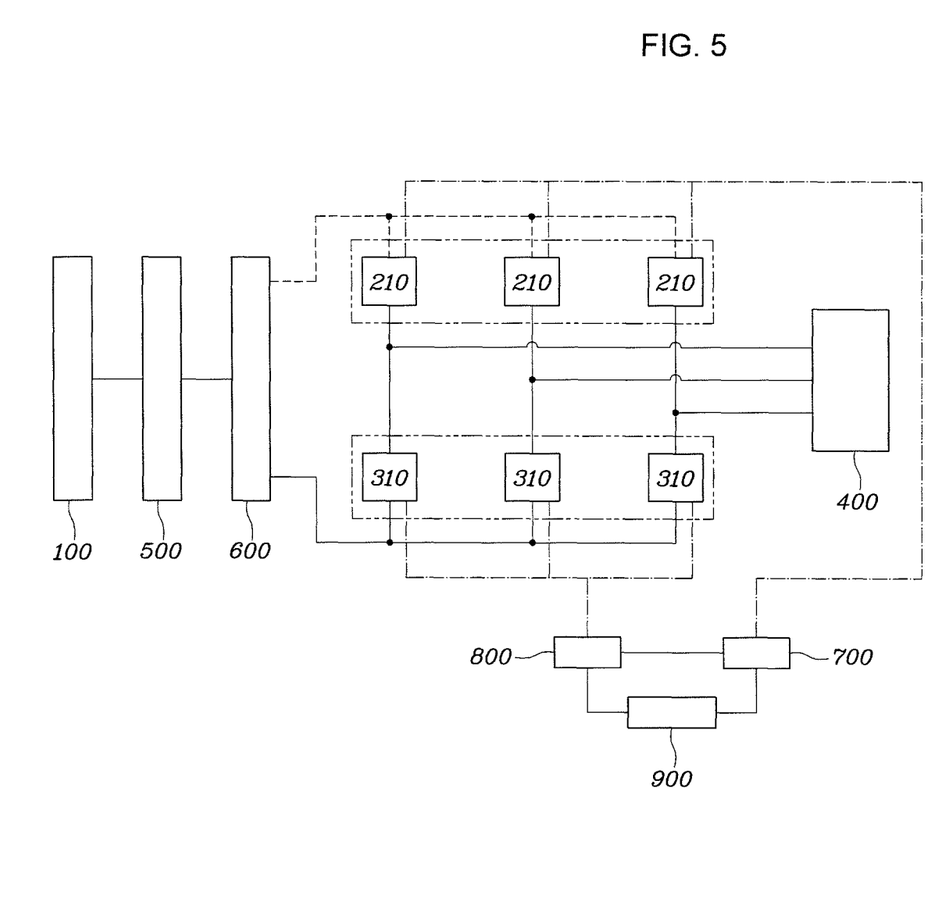
FIG. 5 is a view showing an overall configuration of an inverter system for a vehicle according to various exemplary embodiments of the present invention.

Meanwhile, in the inverter system for a vehicle according to an exemplary embodiment of the present invention, as shown in FIG. 1, the first inverter and the second inverter, a plurality of first switching elements 210 and a plurality of second switching elements 310 are connected in parallel by phases of the motor 40, or according to another exemplary embodiment of the present invention, as shown in FIG. 5, the first inverter including a plurality of first switching elements 210 and the second inverter including a plurality of second switching elements 310 may be separately configured to connect the first inverter and the second inverter in parallel. However, it is merely an exemplary embodiment of the present invention, and the structure of the first inverter including a plurality of first switching elements 210 and the second inverter including a plurality of second switching elements 310 is not limited thereto and various structures may be applied.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An inverter system for a vehicle, the inverter system comprising:
    an energy storage device storing electrical energy;
    a first inverter connected to the energy storage and including a plurality of first switching elements, wherein the first inverter converts the electrical energy stored in the energy storage device into AC power;
    a second inverter including a plurality of second switching elements which are types different from the first switching elements, wherein the second inverter is connected to the energy storage device in parallel with the first inverter, and converts the electrical energy stored in the energy storage device into AC power;
    a motor connected to an output side of the first inverter and an output side of the second inverter in common and driven by receiving the AC power converted by the first inverter and the second inverter;
    a pulse-width modulation (PWM) signal generating device generating a reference PWM signal for controlling driving of the motor, and
    a PWM signal converting device connected to the PWM signal generating device and converting the reference PWM signal into a first PWM signal input into the first inverter to drive the first switching elements, and a second PWM signal input into the second inverter to drive the second switching elements with on/off timing different from on/off timing of the first PWM signal.

2. The inverter system of claim 1, wherein each of the first switching elements is a Silicon carbide-field effect transistor (SiC-FET), and each of the second switching elements is a Silicon-insulated gate bipolar transistor (Si-IGBT).

3. The inverter system of claim 2, wherein the PWM signal converting device converts the reference PWM signal into the first PWM signal when an output demand of the motor is less than a predetermined criterion and wherein the first switching elements are turned on earlier than the second switching elements by a first reference time and are turned off later than the second switching elements by a second reference time.

4. The inverter system of claim 3, wherein the first reference time is longer than a turn-on delay time of the first switching elements.

5. The inverter system of claim 3, wherein the second reference time is longer than a turn-off delay time of the second switching elements.

6. The inverter system of claim 2, wherein the PWM signal converting device converts the reference PWM signal into the second PWM signal when an output demand of the motor is less than a predetermined criterion, and wherein the second switching elements are turned on later than the first switching elements by a first reference time and are turned off earlier than the first switching elements by a second reference time.

7. The inverter system of claim 6,
    wherein the PWM signal converting device converts the reference PWM signal into the first PWM signal when the output demand of the motor is greater than the predetermined criterion so that the first switching elements are turned on before the first reference time when the second switching elements are turned on, and wherein the second switching elements are turned on and the first switching elements are turned off in a third reference time after the first reference time, and
    wherein the first switching elements are turned on again before a fourth reference time when the second switching elements are turned off, so that the second switching elements are turned off and the first switching elements are turned off in the second reference time after the fourth reference time.

8. The inverter system of claim 7, wherein, when the output demand of the motor is greater than the predetermined criterion, the first switching elements are turned off after the second switching elements are turned on and after the third reference time due to a limitation of a maximum current.

9. The inverter system of claim 7, wherein the PWM signal converting device converts the reference PWM signal into the second PWM signal when the output demand of the motor is greater than the predetermined criterion, such that the second switching elements are turned on later than the first switching elements by the first reference time and are turned off earlier than the first switching elements turned on again by the second reference time.

10. The inverter system of claim 7, wherein the third reference time is longer than a turn-on delay time of the second switching elements.

11. The inverter system of claim 7, wherein the fourth reference time is longer than a turn-on delay time of the first switching elements.

12. The inverter system of claim 2, wherein, when an output demand of the motor is less than a predetermined criterion, the first switching elements are driven.

13. The inverter system of claim 2, wherein, when an output demand of the motor is greater than a predetermined criterion, the second switching elements are driven.

14. The inverter system of claim 1, wherein the first inverter has switching and conduction losses lower than switching and conduction losses of the second inverter.

15. The inverter system of claim 1, wherein the reference PWM signal is a PWM signal generated such that an output current of the motor is fed back from the PWM signal generating device, the output current of the motor is compared with a current command, and the output current of the motor follows the current command.

16. The inverter system of claim 1, further including:
    a voltage measuring device measuring a voltage value of the first switching elements;
    a current measuring device measuring a current value flowing into the second switching elements; and an overcurrent determining device determining whether an overcurrent flows into the first switching elements and the second switching elements based on the voltage value measured by the voltage measuring device and the current value measured by the current measuring device.

17. The inverter system of claim 16, wherein the overcurrent determining device determines that the overcurrent flows into the first switching elements when the voltage value measured by the voltage measuring device is higher than a predetermined voltage value.

18. The inverter system of claim 16, wherein the overcurrent determining device derives a voltage value applied to a resistor of the second switching elements based on the current value measured by the current measuring device, and determines that the overcurrent flows into the second switching elements when the derived voltage value is higher than a predetermined voltage value.

* * * * *